United States Patent

Lowe et al.

[11] Patent Number: 6,154,801
[45] Date of Patent: Nov. 28, 2000

[54] VERIFICATION STRATEGY USING EXTERNAL BEHAVIOR MODELING

[75] Inventors: Mike Lowe; Mark LaVine; Jelena Ilic; Paul Berndt; Tahsin Askar, all of Austin; Enrique Rendon, Pflugerville; Hamilton B. Carter, Austin, all of Tex.

[73] Assignee: Advanced Micro Devices, Inc., Sunnyvale, Calif.

[21] Appl. No.: 09/161,342

[22] Filed: Sep. 25, 1998

Related U.S. Application Data

[63] Continuation-in-part of application No. 08/904,504, Jul. 31, 1997, Pat. No. 5,930,482.

[51] Int. Cl.[7] .................................................. G06F 13/368
[52] U.S. Cl. .......................... 710/119; 710/128; 710/129; 710/120; 710/5; 710/6
[58] Field of Search .................... 710/126–129, 710/5, 6, 7, 36–37, 112, 107, 120, 241, 119; 711/154, 167; 713/500

[56] References Cited

U.S. PATENT DOCUMENTS

| | | | |
|---|---|---|---|
| 4,715,035 | 12/1987 | Boehner . | |
| 5,408,637 | 4/1995 | Shimizu . | |
| 5,634,073 | 5/1997 | Collins et al. | 710/15 |
| 5,649,161 | 7/1997 | Andrade et al. | 711/114 |
| 5,715,433 | 2/1998 | Raghavan et al. . | |
| 5,774,681 | 6/1998 | Kunishige | 710/128 |
| 5,813,038 | 9/1998 | Thome et al. | 711/154 |
| 5,815,688 | 9/1998 | Averill . | |
| 5,905,883 | 5/1999 | Kasuya . | |
| 5,953,519 | 9/1999 | Fura . | |

*Primary Examiner*—Glenn A. Auve
*Assistant Examiner*—Raymond N Phan
*Attorney, Agent, or Firm*—Conley, Rose & Tayon, PC; B. Noël Kivlin

[57] ABSTRACT

A verification system and method for verifying operation of an HDL (Hardware Description Language) design of a computer system component are disclosed. The computer system is configured to interface between a first bus and second bus. During verification, a simulated model of the HDL design is coupled to a simulated first bus and a simulated second bus. A designated stimulus is applied to the simulated model through the simulated first bus. A stimulus file stored in the computer system memory is configured to specify the designated stimulus to be applied. In response to the designated stimulus, the simulated model initiates bus cycles on the simulated second bus. A transaction checker is provided in the computer system memory to receive information relating to these bus cycles from said simulated second bus. By employing two different busses—one to apply a stimulus and the other to resolve the bus cycle through transaction checking—an effective decoupling of test stimulus from the checking environment is achieved. Due to decoupling, the test environment can be made more robust, and can be used to generate random responses, remap memory, inject errors into data streams etc.

7 Claims, 10 Drawing Sheets

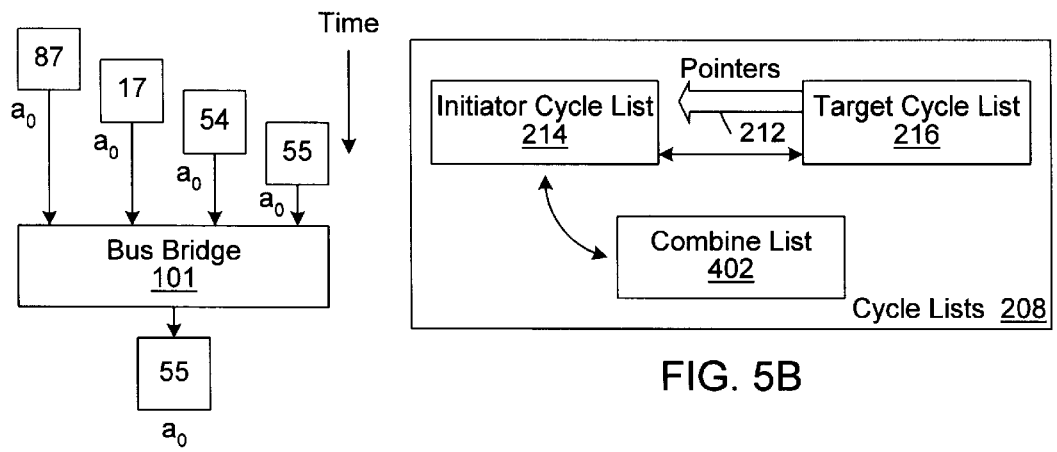
FIG. 5A
FIG. 5B
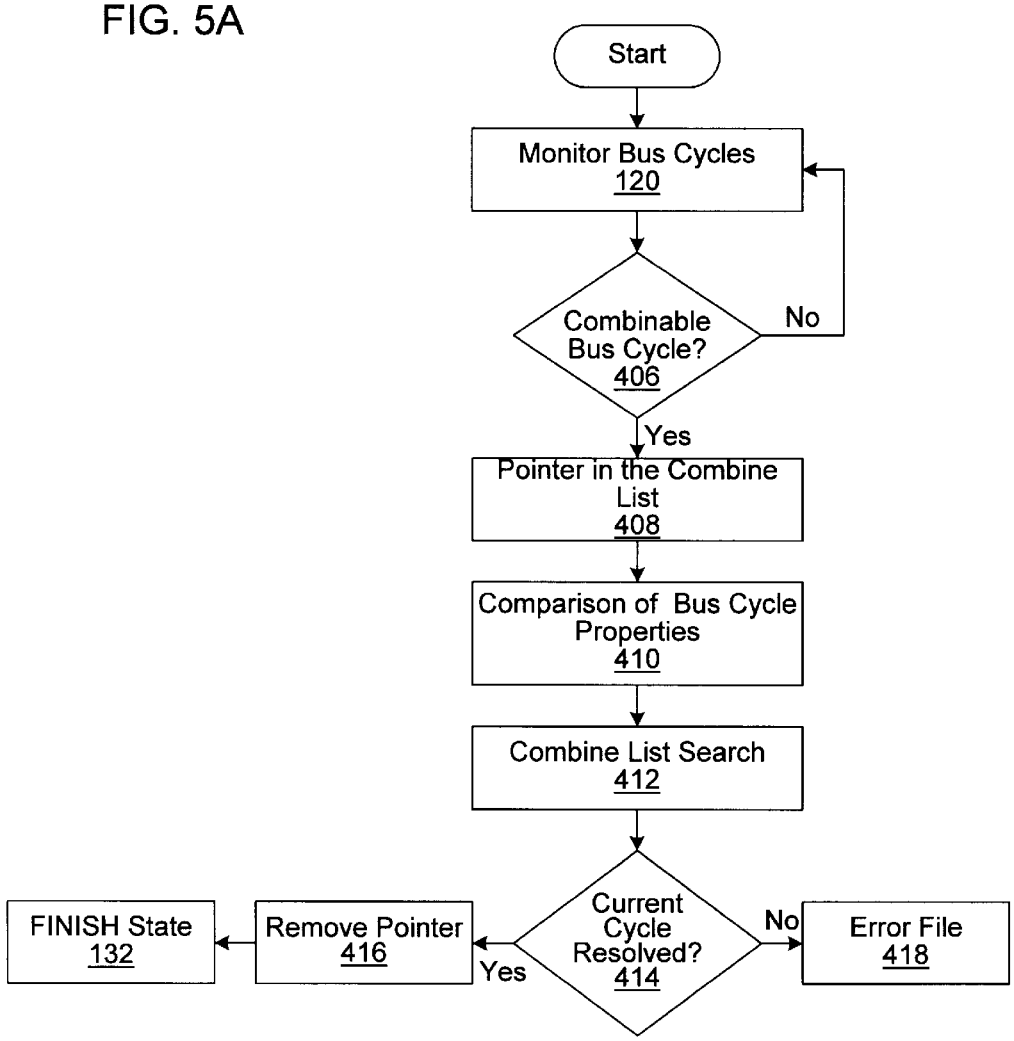
FIG. 5C ced in bus bridge implementations that employ memory
VERIFICATION STRATEGY USING EXTERNAL BEHAVIOR MODELING This application is a continuation-in-part of commonly assigned application Ser. No. 08/904,504, filed Jul. 31, 1997, U.S. Pat. No. 5,930,482, entitled Transaction Checking System for Verifying Bus Bridges in Multi-Master Bus Systems, by Carter, et al.

BACKGROUND OF THE INVENTION

1. Field of the Invention

The present invention relates to devices and methods for testing the functionality of components of a computer system. This disclosure further relates to methodologies for testing the functionality of an HDL (Hardware Description Language) design of a computer system component.

2. Description of the Related Art

Reliability and efficiency of any computer system depend in part upon the system complexity as well as upon the measures taken to minimize or prevent occurrences of faulty operations. Various modern-day mechanisms, including parallel processing, high-speed microprocessors, RISC (Reduced Instruction Set Computer) architectures and on-board hardware redundancies allow faster system performance and throughput while increasing system reliability. Particularly in relatively complex, high performance systems, it is important to provide means for testing the proper functionality of the system and to provide fault corrections both upon the design and manufacture of the various system components, and during system operation.

Monitoring and verifying the functionality of a particular design of a computer system component through software means has undoubtedly proven to be a reasonable alternative to manual verification methodologies and to purely hardware test systems. The use of software for system verification is not, however, entirely without its attendant costs. The time required to perform various tests may be lengthy. Furthermore, and perhaps of greater significance, is the fact that the overall accuracy or coverage of the tests may be limited, thus leading to indications of false failures or to undetected defects.

Corrupted bus cycles in a system can be a major source of loss of reliability or efficiency. It is not uncommon for bus cycles initiated by various bus masters to not reach their desired destinations, or to otherwise be corrupted. This can result from various factors, such as improper hardware design, faults in bus lines, physical or functional defects in chip or board fabrications, and faulty execution in system software routines. A key component in many computer systems, which manages bus cycles, is a bus bridge. Verification systems have thus been developed to verify the design of a bus bridge, either upon its initial design in a hardware description language such as Verilog or following actual hardware implementation.

Historically, verification systems for bus bridge designs have proven inadequate to preserve the right data and right address for every bus cycle in a system involving multiple transactions. One prior art method for testing the functionality of a bus bridge employs reference counts associated with each address being written to memory. The CPU decrements the count upon completion of the write operation. Although every address transaction is given its individual count, this method may fail to preserve address counts in bus bridge implementations that employ memory remapping.

False failures may also be caused by byte merging, i.e. merging of transactions to adjacent or contiguous memory addresses. In this scheme, for example, four cycles into the bus bridge may only create only one cycle out. This may result in the bus bridge erroneously incrementing in multiple counts without decrementing consistent with the merged transactions, thus leading to false indications of error.

Byte collapsing is another source of error in bus transaction verification schemes. In this approach, more than one write cycle to the same memory address may result in only the most recent data being preserved. In other words, the earlier data to the particular address may be overwritten by a later cycle. Here, as in byte merging, the bus bridge testing methodology may fail to preserve the correct address count.

Yet another source of error in previous bus transaction verification schemes is an occurrence of an aborted bus transaction. When cycles to addresses are aborted without being completed, failures occur if the system does not properly track and account for the aborted cycles.

Most transaction testing methodologies for bus bridges treat computer systems as address-based rather than cycle-based. Typical approaches to address and data verification do not take into account the internal states of a machine, nor any other internal states associated with a memory or other system cycles. Critical cycle oriented information may not be considered, causing inadequate verification. When critical bus cycle information is discarded, resolution of later arising cycle conflicts may not be completely sound.

Additionally, the overall performance advantage gained by implementing a software verification tool to test functionality of an HDL design of a computer system component primarily depends upon the relative ease with which a software may execute a complex test suite. This, in turn, depends upon the speed at which a test suite may implement its testing operations.

Historically, operation of a test suite has been dependent on the system configuration—e.g. the amount of memory populating the system, the number of memory banks, type of memory, addresses of PCI bus masters/slaves, modes of external devices such as AGP cards, etc.—under which a system component is being tested. In the area of verifying functionality of chipset devices—which are characterized by the primary function of processing incoming bus cycles and generating subsequent bus cycles on different busses as a result—there are a very large number of possible system configurations. Permuting a test suite across all of these options would result in extremely large numbers of tests. Similarly, the testing in which a test stimulus is run and compared to a previous run may also limit the number of tests that can be run and compared. In such a testing, human evaluation is required when minor differences in test configuration occur. If a major architectural change occurs, then the whole test run must be re-evaluated in full. When the expected data is programmed into the test, traditionally, the tests themselves must be updated when the device under test is updated. The coupled nature of test stimulus and the checking mechanisms may critically restrict the exploitation of the full potential of the testing software.

In many systems, the verification of a device has utilized external memory areas that are required to be coherent in order to verify that data read is equivalent to data written. Typically, data is written to the memory and later read back, expecting that the data read will be identical to data written. For every read operation, a previous write operation must have been performed or a master initialization must have been carried out. This memory coherency requirement may, therefore, waste simulation time in setting up the external memory. It may also restrict the effective memory range from which the device under test can read.

Yet another source of potential limitation on the flexibility of test software is the evaluation of timing related functional problems in a device during a pre-manufacturing simulation. In the past, timing related functional problems were evaluated after manufacturing a device. But, with the advancement in technology, more pre-manufacturing simulation can be performed on a given device. Tests are written to hit specific boundaries or end cases defined by the designer of the device. However, verification of operation of the device across many variations in signal relationships is a key aspect in verifying proper operation of a complex logic product.

Therefore, a bus bridge testing methodology and mechanism are needed to monitor the states of a bus bridge in a computer system to thereby determine proper functionality. Knowledge of the bus bridge states will allow better determination of failures. It is also desirable to have a verification system that monitors and records bus bridge performance, and verifies correct behavior of a bus bridge cache master.

Furthermore, a verification methodology and mechanism are needed to efficiently test the functionality of an HDL design of a computer system component through simulation. It is preferable that to preserve the flexibility of functional verification, the operation of the test suite be decoupled from the programmed mode or configuration of the device under test. It is also desirable to maximize functional verification of the HDL design by taking advantage of incoherent external memory space along with a decoupling of the test stimulus from the checking mechanisms. Detection of timing-related functional problems in a device prior to its manufacture with an improved simulation of a broad range of inter-signal relationships would similarly be desirable.

SUMMARY OF THE INVENTION

In one embodiment, a bus bridge design verification system is provided in which bus cycles are treated as individual persistent objects. Additionally, functional verification of an HDL design of a computer system component is also accomplished by utilizing the principles of object oriented design to implement the system and methodology of the present invention.

A state machine model is created for each bus in the system. Each bus model (or bus object) is passed various stimulus generated on real or simulated system buses under test. As a bus object receives stimulus corresponding to new bus cycles, the bus object is responsible for instantiating corresponding bus cycle state machine objects and storing or identifying them in at least one of a plurality of bus cycle lists.

In one embodiment, there are three dynamically allocated lists for storing bus cycle state machine objects in the system. The first two lists hold cycles initiated by bus masters and cycles sent to bus targets, and are called the initiator cycle list and the target cycle list, respectively. The third list is a special purpose list for resolving initiator cycles when they have been modified due to a process called data combining or collapsing. This third list, referred to as the combine list, allows combinable bus cycles to also be predictably resolved.

The initiator cycle list and the target cycle list are passed the same stimulus generated for each bus object in the system, and the cycle lists, in turn, pass that stimulus to each bus cycle state machine object they contain. The cycle lists provide an organized structure for holding the bus cycles and passing the necessary stimulus to them so they may transition through their state machines. Each bus cycle state machine object transitions from state to state in response to certain stimulus signals according to the protocol of the associated bus. The state machine of each bus cycle state machine object transitions through its various states to verify and track the bus transaction according to the bus protocol and to collect address, data and clock cycle information, etc., as desired, to facilitate debug and fault correction.

The bus cycle state machine objects themselves are responsible for most of the transaction checking verification. The bus cycle state machines transition in response to bus signals according to the protocol of the associated bus. After protocol checking and completion of the bus transactions, each bus cycle state machine transitions into a respective holding state and remains therein until all data for the transaction associated with the bus cycle has been accounted for (e.g., corresponding transactions on target buses have been effectuated). False failures caused by merging of cycle data are no longer created due to data masking employed by the byte granularity data checking methodology of one embodiment.

Thus, the system monitors and stores various pertinent performance information associated with the bus bridge. Bus objects along with cycle lists and bus cycle state machine objects track resource usage and monitor bus bridge performance with the help of a statistics-keeping object.

In one embodiment, the bus bridge is monitored in a device independent manner, so that false failures can be eliminated and tighter verification of bus bridge operation can be accomplished. A bus bridge model object is created with storage space allocated for each of the bus bridge's configuration registers. Bus cycle state machine objects poll this bus bridge model to determine bus bridge state to thereby make decisions (e.g., remapping, DRAM configuration, etc.) regarding how the cycle should be resolved. Future bus bridge designs can also be tested in a device independent manner by simple modifications to the system disclosed.

In still another embodiment, a methodology provides detection of cache coherency errors in addition to detection of inefficient cache use by a cache controller. A cache model object is created with storage (or pointers to dynamically allocated storage) for the address, data and cache status (e.g., MESI states) of each cache line. A cycle list is further provided that stores pointers to non-cache bus cycles. The address and data contained by each cache line as well as the coherency state of the cache line (e.g., MESI state, or other cache coherency protocol state) is tracked in the cache model object . Non-cache bus cycles, in turn, poll the cache model object to determine their proper resolution. In addition, when cache updates occur, the cache model may be configured to invoke coherency tests upon non-cache bus cycle state machine objects to verify proper performance.

Flexibility of functional verification of an HDL design of a computer system component is maximized by allowing the test stimulus and checking to be decoupled from the programmed mode or configuration of the device. To keep the tests manageable, configuration and bus stimulus are separated, with the configurations defined dynamically at run time based on parameters passed into the simulation at run time. The real-time tracking of configurations is achieved via an internal configuration interpretation mechanism, preferably as a persistent object.

The stimulus generation and checking mechanisms are also decoupled from each other in that the stimulus is applied to a simulation of a first bus, whereas a transaction checker is coupled to a simulation of a second bus to receive transaction-checking information. Each simulation run of a stimulus thus becomes independent of device-under-test modifications and enhancements. Additional flexibility in simulation is achieved by removing memory coherency when a stimulus is applied to the HDL design of the computer system component. The stimulus applied to the HDL design during a memory read operation is not constrained by previously initialized values or previously written values during a memory write operation.

In one embodiment, a windowing strategy is employed to detect timing-related functional problems in a device prior to its manufacture. During a pre-manufacturing simulation, a reference point or signal is selected (such as an external bus cycle for a chipset device) and the given transaction signal or signals are programmed with an initial delay and duration values. The testing of the device response to inter-signal relationships can then be carried out multiple times, with the delay of the transaction signal with respect to the reference signal being changed for each iteration of the test.

Thus, a transaction checking system and method may achieve automatic verification of bus bridges without being adversely affected by false failures caused by address remapping, byte merging or byte collapsing. A reliable and efficient method of monitoring system buses by simulation through object oriented designs is further provided. Functionality of an HDL design of a computer system component may also be efficiently verified through a variety of testing methodologies.

BRIEF DESCRIPTION OF THE DRAWINGS

Other objects and advantages of the invention will become apparent upon reading the following detailed description and upon reference to the accompanying drawings in which:

FIG. 5A depicts a byte collapsing operation through a bus bridge.

FIG. 5B introduces a combine list for correctly resolving collapsed data cycles in posted write buffers.

FIG. 5C is an operational flow diagram for the arrangement in FIG. 5B.

Figure 1A:
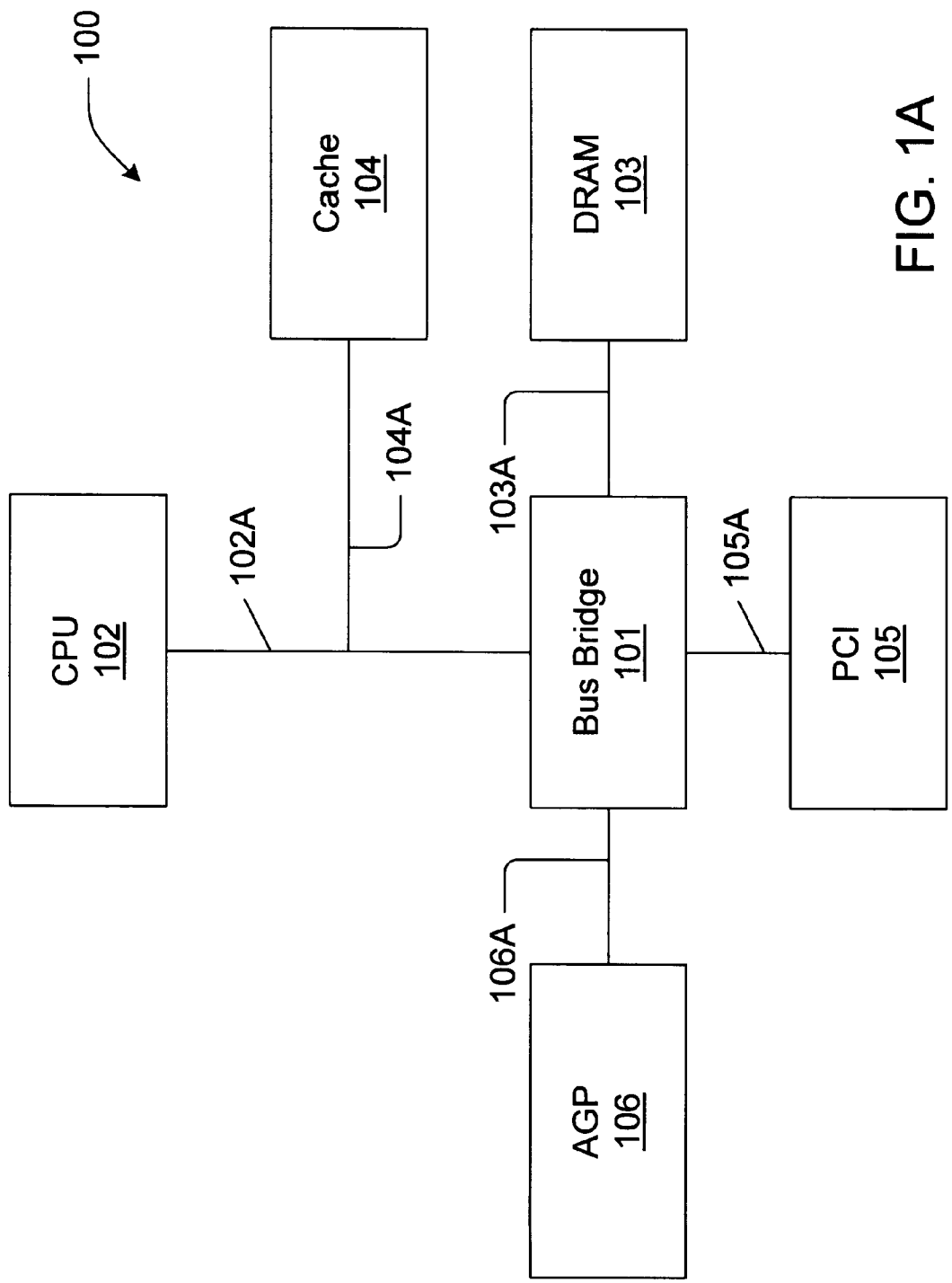
FIG. 1A is a block diagram of a computer system including a bus bridge.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DESCRIPTION OF THE PREFERRED EMBODIMENT

Referring now to FIG. 1A, there is shown a general circuit layout of a computer system 100. A bus bridge 101 is shown connected to various system elements including a CPU 102, a DRAM memory 103, a cache 104 and one or more PCI (Peripheral Component Interconnect) devices 105. An Advanced Graphics Port (AGP) device 106 is also shown connected to the bus bridge 101. Various system buses 103A, 104A, 105A and 106A are also shown in FIG. 1A.

The bus bridge verification system of the present invention may be executable by the computer system 100, or by any other general purpose or specialized computer system. The bus bridge verification system as described below may be used to verify the functionality of a bus bridge design, such as bus bridge 101, either upon its initial expression in a hardware description language such as Verilog or following actual hardware implementation.

Figure 1B:
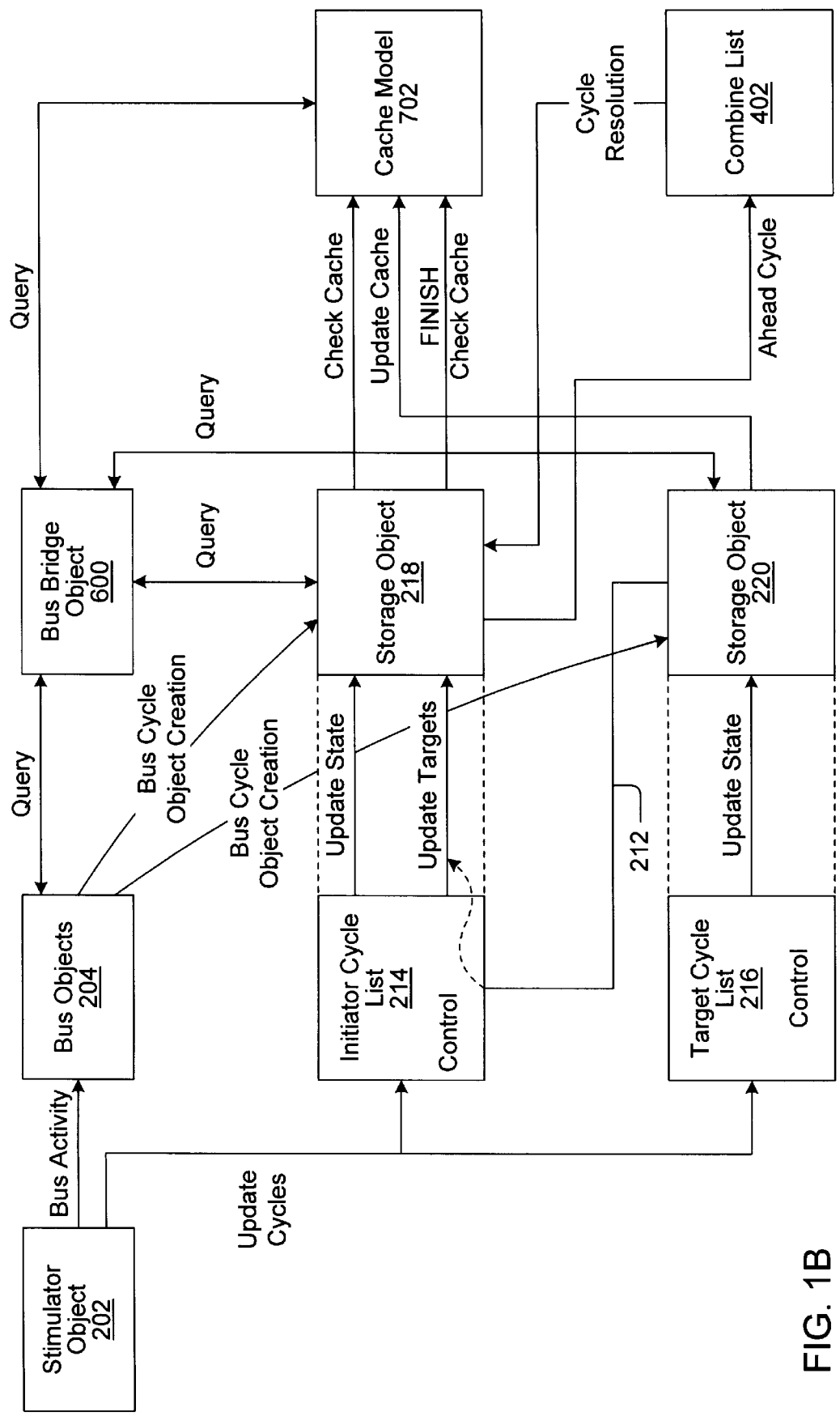
FIG. 1B is a command flow diagram of an object oriented bus bridge design verification system.

FIG. 1B is a general command flow diagram of one embodiment of a bus bridge verification system. As will be explained in further detail below, the bus bridge verification system treats bus cycles as individual persistent objects. Various additional objects are created to allow for the resolution of created bus cycles, as well as to allow for statistics keeping and other functionality.

In FIG. 1B, a stimulator object 202 is shown which passes bus stimulus on a clock cycle basis to a plurality of bus objects 204, and also to an initiator cycle list 214 and to a target cycle list 216. This bus stimulus corresponds to bus signal activity occurring on each of the buses associated with the bus bridge design being verified. Each bus is also modeled as an individual, persistent object as represented collectively by the block 204. Two storage objects, 218 and 220, are shown associated with their respective cycle lists 214 and 216 to store corresponding bus cycle state machine objects created by corresponding bus objects upon detection of the initiation of corresponding bus cycles.

The cycle lists, 214 and 216, are configured to pass the bus stimulus from the stimulator object 202 to their corresponding storage objects 218 and 220 so as to allow for updating of states of corresponding bus cycle state machine objects. A bus bridge model object 600 may be created as an object with storage space allocated for the bus bridge's 101 configuration registers. The bus bridge object 600 updates its registers using data received from the CPU bus object. Various bus cycle state machine objects may poll the bus bridge object 600 for information on the bus bridge's 101 currently-set configuration to thereby determine how cycles should be resolved.

A third cycle list, the combine list 402, interacts with the initiator cycle list 214 to resolve combinable bus cycles created during byte collapsing operations. Finally, a cache model object 702 is also created to detect cache coherency errors through interactions with the initiator cycle list 214 and the target cycle list 216. The cache model object 702 may also query the bus bridge object 600 to find configuration information pertinent to its operation, such as cache size, write-back or write-through cache, etc. Various detailed aspects of one embodiment of the bus bridge verification system of FIG. 1B are described next with reference to FIGS. 2 through 7B.

Figure 2:
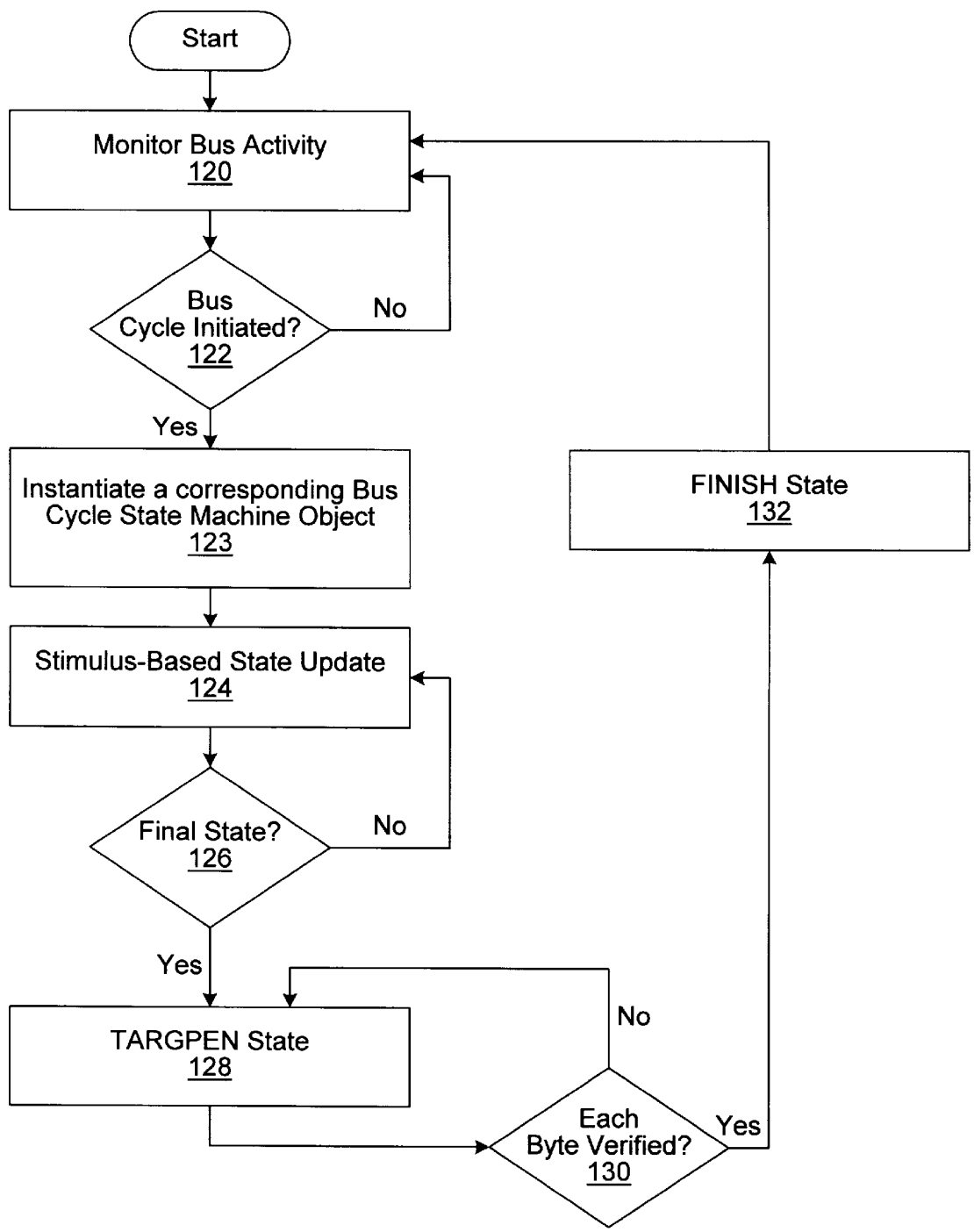
FIG. 2 is a flow chart for state machine based bus cycle completion checking.

Referring now to FIG. 2, a method for checking completion of each of a plurality of bus cycles is shown through a simplified flow chart. As depicted therein, initially, bus activity is monitored (step 120) by respective bus objects to detect the initiation of each bus cycle (step 122). Each bus cycle generated by the bus bridge system is described as a state machine object. As each bus cycle begins, a state machine object corresponding to that cycle is instantiated during step 123. For example, if there is a memory write cycle on the CPU bus 102A, then a state machine object for that cycle will be created. This cycle-based approach allows critical monitoring of the bus bridge functionality and avoids instances of false failures arising from address remapping, byte merging or byte collapsing, as will be described further below. Bus cycle state machine objects also provide a means of persistent storage for various other verification tasks.

Figure 3A:
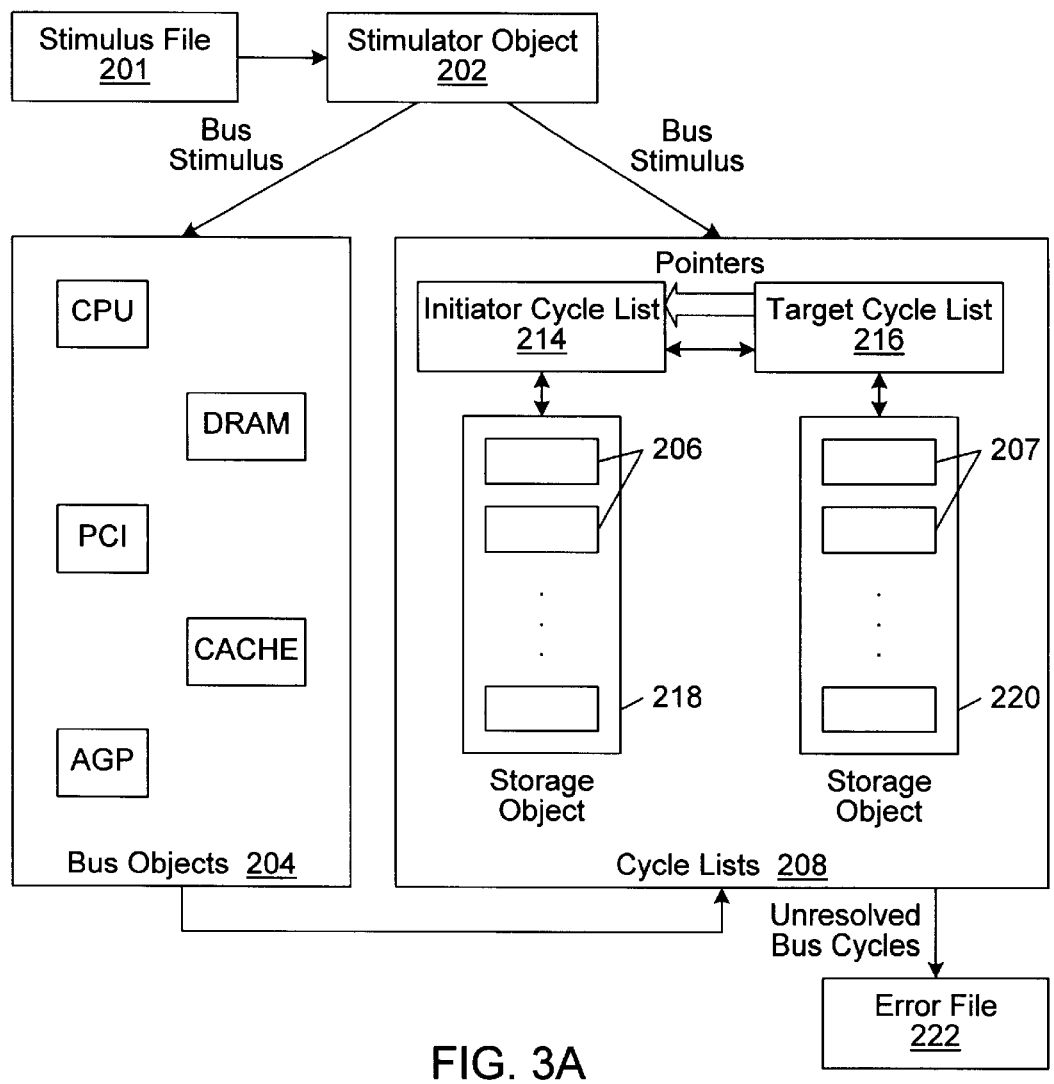
FIG. 3A shows the functional elements in a list based bus cycle resolution checking.

The bus cycle state machine object for a particular bus cycle contains storage for that bus cycle's properties such as clock cycle number, cycle address, cycle type (i.e. read or write), cycle data and the status of byte enables. A state machine object updates its state (step 124) based on the bus stimulus passed to it on each clock cycle. Referring to FIG. 3A, a stimulator object 202 is created to provide this bus stimulus to a plurality of cycle lists 208, which in this embodiment includes an initiator cycle list 214 and a target cycle list 216. Each cycle list, in turn, passes this stimulus to corresponding bus cycle state machine objects (206 and 207) stored therein. Additional aspects regarding this operation will be provided further below.

Referring back to FIG. 2, the final state in the state-machine based transition scheme of each bus cycle state machine object is a holding state, conveniently referred to as the TARGPEN state illustrated by step 128. The bus cycle state machine object remains in the TARGPEN state until the state machine verifies that each byte of its transaction is accounted for and has been routed to the proper destination (step 130). In other words, a bus cycle state machine object remains in the TARGPEN state until it is resolved by determining that any corresponding cycles on other buses have in fact, been effectuated. When all resolution checks are completed in the TARGPEN state 128 the state machine object transitions to the FINISH state illustrated by step 132 which signals that the bus cycle is complete and that the state machine object can be destroyed by the corresponding cycle list. Thus, state machine objects are created and destroyed on a bus cycle basis. This allows verification that the bus bridge is asserting signals correctly for each bus transaction. Further details regarding this operation are also provided below.

The stimulator object 202 in FIG. 3A reads all stimulus from a set, i.e. a stimulus file 201, of real or simulated buses associated with the bus bridge being verified. Cycles or other signals generated by the bus bridge being verified cause entries to be provided in the stimulus file 201. These stimulus are ultimately detected by a corresponding bus object (i.e., the bus object corresponding to the bus upon which the signal or cycle is generated). Upon detection of a cycle generated by the bus bridge, the corresponding bus object creates a bus cycle state machine object. For most cycles generated by the bus bridge, this bus cycle state machine object is provided to the storage object 220 associated with the target cycle list 216, since they are normally target cycles. Similarly, cycles generated by devices external to the bus bridge are also provided to the stimulus file, and may result in similar creations of bus cycle state machine objects. Bus cycle state machine objects that result from externally generated bus cycles are generally provided to storage object 218 associated with the initiator cycle list 214, since they are normally initiator cycles. However, it is noted that for certain types of cycles, a bus cycle state machine object may be provided to both the storage object 218 associated with initiator cycle list 214 and to the storage object 220 associated with target cycle list 216. For example, in one embodiment a bus cycle state machine object created as a result of a CPU writeback cycle is provided to both storage object 218 and storage object 220 associated with the initiator cycle list 214 and target cycle list 216, respectively. In addition, it is noted that certain bus cycle state machine objects created as a result of cycles generated by the bus bridge are provided to the storage object 218 associated with initiator cycle list 214 rather than to storage object 220, such as bus cycle state machine objects created as a result of cache line replacement read cycles from the cache memory.

It is also noted that the object oriented verification system may be applied to a bus bridge simulation model and that no physical components are needed to be connected. C++language has been found to be well-suited for implementation of the verification system. Stimulus file 201 contains lines, each line storing a bus stimulus on a per clock basis. Logic analyzers can also be used to generate the stimulus file 201. Bus bridge performance can also be tested through externally simulated bus signals.

As stated previously, the stimulator object 202 passes the stimulus on a clock cycle basis to a plurality of bus objects 204 and also to a plurality of cycle lists 208. Both the bus objects 204 and the cycle lists 208 are stored in the memory of the computer system 100. The system treats each bus as an individual, persistent object as represented by the block 204 in FIG. 3A. Various bus cycles on system buses are also modeled as objects. Each bus object from the plurality of bus objects 204 monitors the stimulus passed to it by the stimulator object 202 to detect the initiation of a bus cycle. When a bus cycle is initiated, the bus object corresponding to the bus upon which the cycle occurs instantiates a bus cycle state machine object—collectively represented as blocks 206 and 207 in FIG. 3A—for that particular bus cycle. That bus object also simultaneously stores that instantiated bus cycle state machine object, 206 or 207, in one of the plurality of cycle lists 208 depending upon whether the cycle is an initiator cycle or a target cycle, as described above.

Thus, in the embodiment of FIG. 3A, each bus object is responsible for placing the created bus cycle state machine objects into the appropriate cycle list, 214 or 216. The bus objects 204 are also configured to pass available bus cycle creation data, i.e. the bus cycle's properties, such as initial cycle address, cycle type, clock cycle number and status of byte enables, etc., to individual bus cycle state machine objects upon their creation. The bus cycle state machine objects, 206 and 207, are configured to store their individual bus cycle's properties. The cycle lists 208 provide an organized structure for holding the bus cycle state machine objects 206 and passing the necessary stimulus to them so they may transition through their state machines. Thus, for example, when the CPU 102 attempts to write into the DRAM 103, the CPU bus object creates a bus cycle state machine object and stores it in the initiator cycle list 214; whereas, following generation of a corresponding cycle on the memory bus, the DRAM bus object creates another bus cycle state machine object and stores it in the target cycle list 216.

Figure 3B:
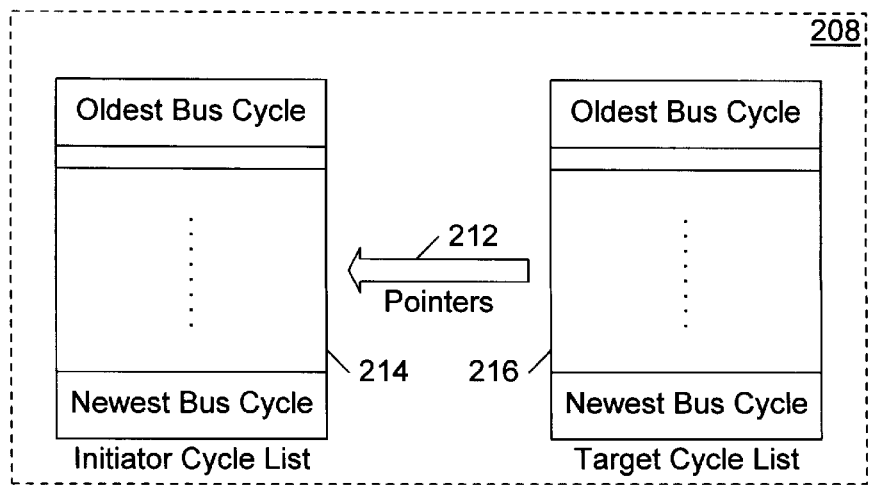
FIG. 3B depicts the pointer operation between the initiator cycle list and the target cycle list as part of bus cycle resolution checking.

In one embodiment, two cycle lists are created as illustrated in FIGS. 3A and 3B, block 208. Each cycle list itself is treated as an object. Cycles initiated by bus masters are stored in the initiator cycle list 214, whereas cycles sent to bus targets are held by the target list 216. Initially, on each clock cycle, each cycle list polls its bus cycle state machine objects for their current state. As described earlier in connection with FIG. 2, each bus cycle state machine object transitions through a sequence of states. Thus, when, during its polling, a cycle list finds a bus cycle state machine object in its FINISH state, it removes it from the list because that bus cycle has been successfully completed.

After initial polling, each cycle list passes the stimulus from the current clock cycle to each of the bus cycle state machine objects stored therein. As further depicted in FIG. 3B, bus cycles are stored, through their state machine objects, in an appropriate order. Thus, oldest bus cycles are stored at the cycle list head, and newest bus cycles are stored at the cycle list tail. Each line of stimulus in the stimulus file 201 is eventually fed to every bus cycle through the plurality of cycle lists 208, on a clock cycle basis. In one embodiment, the stimulus to the bus cycle state machine objects is passed in the order list head to list tail, i.e. from the oldest bus cycles to the newest bus cycles. Passing the stimulus to the bus cycles in this order facilitates various tasks, such as insuring that pipelined bus cycles claim the correct data from the bus, while keeping all cycles updated in their states. The bus cycle state machine objects transition their state machines accordingly, as described earlier with reference to FIG. 2.

Next, the initiator cycle list 214 passes a set of pointers 212 that point to bus cycle state machine objects in the target list 216 to each initiator bus cycle state machine object. The pointers 212 are provided to the initiator cycle list 214 from the target cycle list 216. The pointers 212 are passed to the oldest initiator bus cycle state machine object first. In one embodiment, a first pointer is passed to the oldest initiator bus cycle state machine object that points to the newest target bus cycle state machine object. This pointer is then successively passed to more recently occurring bus cycle state machine objects the initiator cycle list (i.e., stored in storage object 218). Subsequently, a pointer which points to the second most recent bus cycle state machine object in the target cycle list 216 is provided first to the oldest bus cycle state machine object in the initiator cycle list 214, and so on until it is passed to the newest entry in the initiator cycle list 214. This process is repeated until a pointer to the oldest bus cycle state machine object in the target cycle list 216 is provided to each entry of the initiator cycle list 214. As will be described further below, these pointers are used by each bus cycle state machine object 206 associated with the initiator cycle list 214 to pair it with a bus cycle state machine object 207 associated with the target cycle list 216 to determine whether the paired cycles resolve, or partially resolve, each other.

It is noted that in other embodiments, other methodologies are possible for allowing initiator bus cycle state machine objects to pair with corresponding target bus cycle state machine objects for cycle resolution. For example, while in the embodiment described above a pointer to the newest bus cycle state machine object in the target cycle list 216 is provided first to the oldest entry in the initiator cycle list 214, and successively to the oldest entry in the initiator cycle list 214, and so on, in other embodiments, the specific order in which pointers are passed between the cycle lists for cycle pairing may be varied.

If an initiator bus cycle state machine object has transitioned to its TARGPEN state 128 (FIG. 2)—(i.e. a state indicating that the bus protocol for the corresponding cycle was properly completed and only resolution of target data is pending), or if an initiator cycle state machine object has transmitted at least one data packet as may occur, for example, during a PCI burst cycle that writes to DRAM, then that initiator bus cycle state machine object polls the corresponding target bus cycle state machine object (i.e., the target bus cycle state machine object that is pointed to by the current pointer passed to the initiator bus cycle state machine object) for the target bus cycle state machine object's properties. These properties include cycle type, cycle address, cycle byte enables, cycle data, and others, as desired. If each of these properties matches the predetermined resolution properties for the initiator cycle state machine object, the data for that initiator cycle is marked as resolved. As described further below, when matching data for cycles are found, the byte enable bits for that data are cleared. When all the byte enables for a particular cycle have been cleared, thus indicating a complete resolution for the cycle, it enters the FINISH state and is removed from the cycle list.

Two storage objects, 218 and 220, may be provided which are associated with their corresponding cycle lists 214 and 216 (FIG. 3A) to store corresponding bus cycle state machine objects. At the end of a simulated test, the system may still have a number of unresolved bus cycles in the initiator cycle list 214. Each of these unresolved bus cycle state machine objects remains in the corresponding storage object to facilitate debugging. The number and complexity of cycle lists 208 as well as of storage objects can be varied depending on the test requirements of the application at hand. The storage objects can either be separately associated with cycle list objects or can be incorporated as an integral part of each. An error file 222 may be created to store all pertinent information about unresolved initiator and target cycles. This file can later be accessed by a user for inspection or debugging purpose. All these objects are stored in appropriate system memory.

Figure 4A:
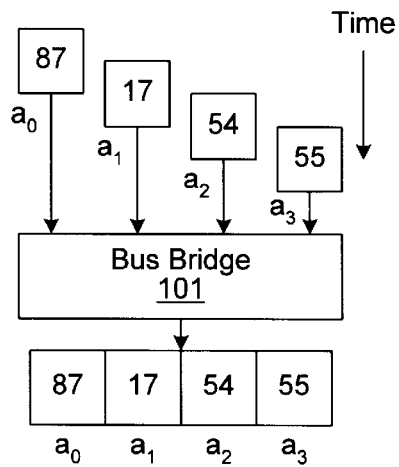
FIG. 4A shows a data merging operation performed by a bus bridge.

A further implementation of the system addresses the situation of byte merging. As discussed above, previous methodologies have suffered from false failures due to data merging performed by the bus bridge to enhance performance. FIG. 4A generally depicts a situation where a bus bridge 101 merges transactions to adjacent or contiguous memory addresses. Four cycles into the bus bridge 101 result in only one cycle out (e.g., to DRAM 103). Previous methodologies assumed that at least one target bus cycle would exist for each initiated bus cycle. This assumption caused verification systems to flag incorrect data for initiator cycles that did not utilize all bytes on the bus. In the present embodiment, a methodology is provided which tracks cycle data with byte granularity.

As described earlier, byte enables, among other cycle properties, are stored along with each instantiated bus cycle state machine object. It was also mentioned before with reference to FIG. 2 that when each instantiated cycle object completes its state machine (i.e., the bus transaction has completed), it enters a holding state called the TARGPEN state, represented by block 128 in FIGS. 2 and 4B.

In this TARGPEN state 128 or after at least one data packet has been sent by an initiator cycle, as may occur, for example, during a PCI burst cycle that writes to DRAM, the initiator bus cycle state machine object compares its cycle properties to those of a paired target bus cycle state machine object (which is pointed to by the current pointer it received from the initiator cycle list 214), as already discussed above with reference to FIGS. 3A and 3B. In the present embodiment, rather than comparing an entire bus width of data, the initiator bus cycle state machine object logically masks, e.g. with a logical OR, its byte enables with those of the pointed-to target bus cycle state machine object. Byte enables are only compared when the initiator and target cycles have the same cycle address (or corresponding bus cycle addresses, in situations where address translation has occurred within the bus bridge (such as, for example, certain AGP operations)) and are of the same type (i.e., read or write), as represented by block 301 in FIG. 4B. Data itself it compared only when the initiator and the target cycles have one or more common byte enables, as represented by the block 302 in FIG. 4B. After this step, each enabled data byte is compared to find matching data, as shown by the blocks 304, 306, 307 and 308. When a data byte is found matching in the paired bus cycle state machine objects, the bus cycle state machine object in the initiator cycle list 214 (FIG. 3A) toggles (or clears) the byte enable bit associated with it so that the data byte is considered no longer enabled. That initiator cycle state machine object then instructs the target cycle state machine object to toggle its corresponding byte enable in the same manner as represented by block 310 in FIG. 4B. The clearing of the target cycle byte enable prevents more than one initiator cycle from using the same target cycle data and also allows target cycles to be removed from the target cycle list 216 when all their data have been used (i.e., when all byte enables for the cycle have been cleared). The data corresponding to any other common byte enables in the paired initiator-target cycles are similarly compared to selectively clear the byte enables.

Figure 4B:
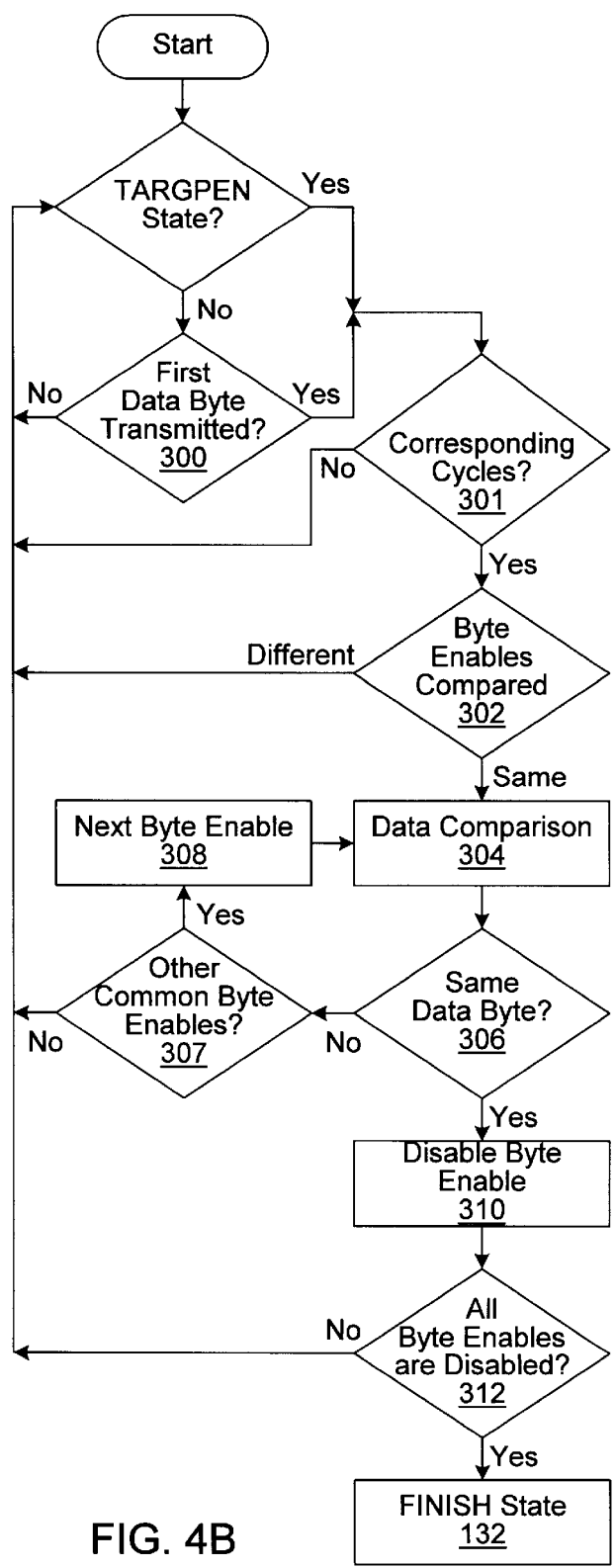
FIG. 4B shows a method of byte granularity data checking to eliminate misresolved bus cycles during data merging.

The initiator cycle state machine object remains in the TARGPEN state until all of its byte enables are no longer asserted, as depicted by block 312 in FIG. 4B. When the initiator cycle object exits from its TARGPEN state and enters a FINISH state 132 (also shown in FIG. 2), it is an indication that all of its data have been accounted for. The discussion for this embodiment assumes that the system data bus is 32-bit wide, and hence, there can be four data bytes per clock cycle. Further, there can be four byte-enables too, one for each data byte. However, it is clear from this discussion that the system can be modified to adapt to different bus widths, e.g. 8-bit data bus, 16-bit data bus, 64-bit data bus etc., and to other specific system requirements.

It is noted that after a particular bus cycle state machine object in the initiator list performs the resolution check as depicted in FIG. 4B with a paired bus cycle state machine object in the target list, the initiator cycle list will cause the pairing of other initiator-target cycles (i.e., through the passing of pointers as described above) to continue the resolution checking process. This process is on-going as long as there are bus cycle state machine objects in the initiator and target lists.

As briefly described before, previous transaction checkers have also produced false failures due to a process called data combining or byte collapsing used by bus bridges to improve performance. Byte collapsing is distinct from byte merging. When two or more subsequent cycles are to the same address, the bus bridge 101 may throw away the first cycles and only propagate the data of the most recent cycle as shown in the situation depicted by FIG. 5A. The manner in which data combining or byte collapsing is handled to properly resolve bus cycles in one embodiment of the system is described next.

Referring to FIG. 5B, in addition to the two cycle lists described previously, i.e. the initiator cycle list 214 and the target cycle list 216 as collectively illustrated by the block 208 in FIG. 3A, a third cycle list may also be created. The third list is called the combine list and is shown as block 402 in FIG. 5B. This combine list 402 is a first-in-first-out (FIFO) list with the number of entries equal to the number of entries in the bus bridge's posted write buffer. As with the initiator and target cycle lists, the combine cycle list is also an object stored in the appropriate system memory.

As discussed in connection with FIG. 3A, each bus object from a plurality of bus objects 204 monitors the stimulus passed to it by the stimulator object 202 to detect the initiation of a bus cycle. This is also represented by the block 120 in FIGS. 2 and 5C. As each combinable bus cycle is created, i.e. a cycle wherein bytes are collapsed as depicted in FIG. 5A, each bus cycle state machine object associated with the combinable bus cycle places a pointer to itself in the combine list 402 during step 408. When a bus cycle state machine object, in the initiator cycle list 214, for that combinable bus cycle transitions through its states and enters a holding state or if that bus cycle state machine object has transmitted at least one data packet, the initiator cycle list 214 polls the target cycle list 216 for a corresponding matching bus cycle state machine object, as discussed above with reference to FIG. 3B, during step 410.

If a bus cycle state machine object in the initiator list finds a target cycle that matches its address, one or more byte enables and target cycle type, but has different data, then the initiator cycle list 214 searches the combine list 402 during step 412 for an initiated bus cycle having cycle, address and byte enable attributes identical to those for the combinable bus cycle, but a later clock cycle number. If such a cycle is found and the cycle's data matches the data from the target cycle, then the initiator cycle list marks that byte enable bit for the original data-mismatched combinable initiator cycle as resolved (i.e., clears the byte enable bit). In addition, the pointer to the resolved initiator bus cycle state machine object is removed from the combine list 402. The resolution checking of subsequent initiator bus cycle state machine objects is handled similarly. When the initiator bus cycle state machine object that corresponds to the last cycle involved in a combined target cycle undergoes its resolution checking process as described above, that object will resolve with the target bus cycle state machine object of the combined cycle. Additionally, the pointer to that initiator bus cycle state machine object in the combine list 402 is removed upon resolution.

When a cycle is combinable, even if the appropriate data and address resolutions are found from a DRAM cycle—i.e. a target cycle, it may be advantageous to first check the combine list 402 for any cycle ahead of the current combinable cycle that uses the same data and address, as is also generally shown in FIG. 1B. If such a cycle is found, then the initiator list 214 may be configured not to allow the current combinable cycle to claim resolution from that DRAM cycle. Instead, the initiator cycle list may allow the newest cycle in the combine list 402 with that address and data to claim resolution from the DRAM cycle, and may resolve all previous cycles with that data and address from the newest cycle in the combine list 402. Using the combine list technique disclosed in the present embodiment, the latest cycle would not see a DRAM data mismatch.

As each combinable bus cycle completes—i.e. transitions through its protocol checking state machine and resolves all its data according to the methodology described herein, it sends a message to the combine list. The combine list 402, in turn, removes the pointer to that combinable cycle upon receipt of this message during steps 414 and 416. The combinable bus cycle state machine object, having been completely resolved, thus enters into its FINISH state 132 (FIG. 5C) indicating cycle completion as discussed earlier in connection with FIG. 2.

The length of the pointer in the combine list can vary depending on the implementation. In one specific embodiment, the maximum pointer length is about four bytes. Further, during a test, there may be occasions when the combinable cycle is not fully resolved. In such a situation, the unresolved bus cycle state machine objects remain in their corresponding storage objects—i.e. unresolved initiator cycles will remain in the storage object 218, whereas unresolved target cycles will remain in the storage object 220 (FIGS. 1B and 3A). The concept and functions of the storage object were discussed previously with reference to FIG. 2A.

The initiator and the target cycle lists can be configured to be responsive to a user request to download any pertinent information about unresolved bus cycles to a file for inspection and debugging. In one embodiment, an error file 222 (FIG. 3A) stores all pertinent information about unresolved initiator and target bus cycles (block 418, FIG. 5C), except for any unresolved target cycle reads, which can be destroyed without being reported. For example, any unresolved DRAM reads can be destroyed without reporting them in the error file. Further, a system-wide cycle history file can also be created to store history of each bus cycle—whether resolved or not—in the system.

Figure 6:
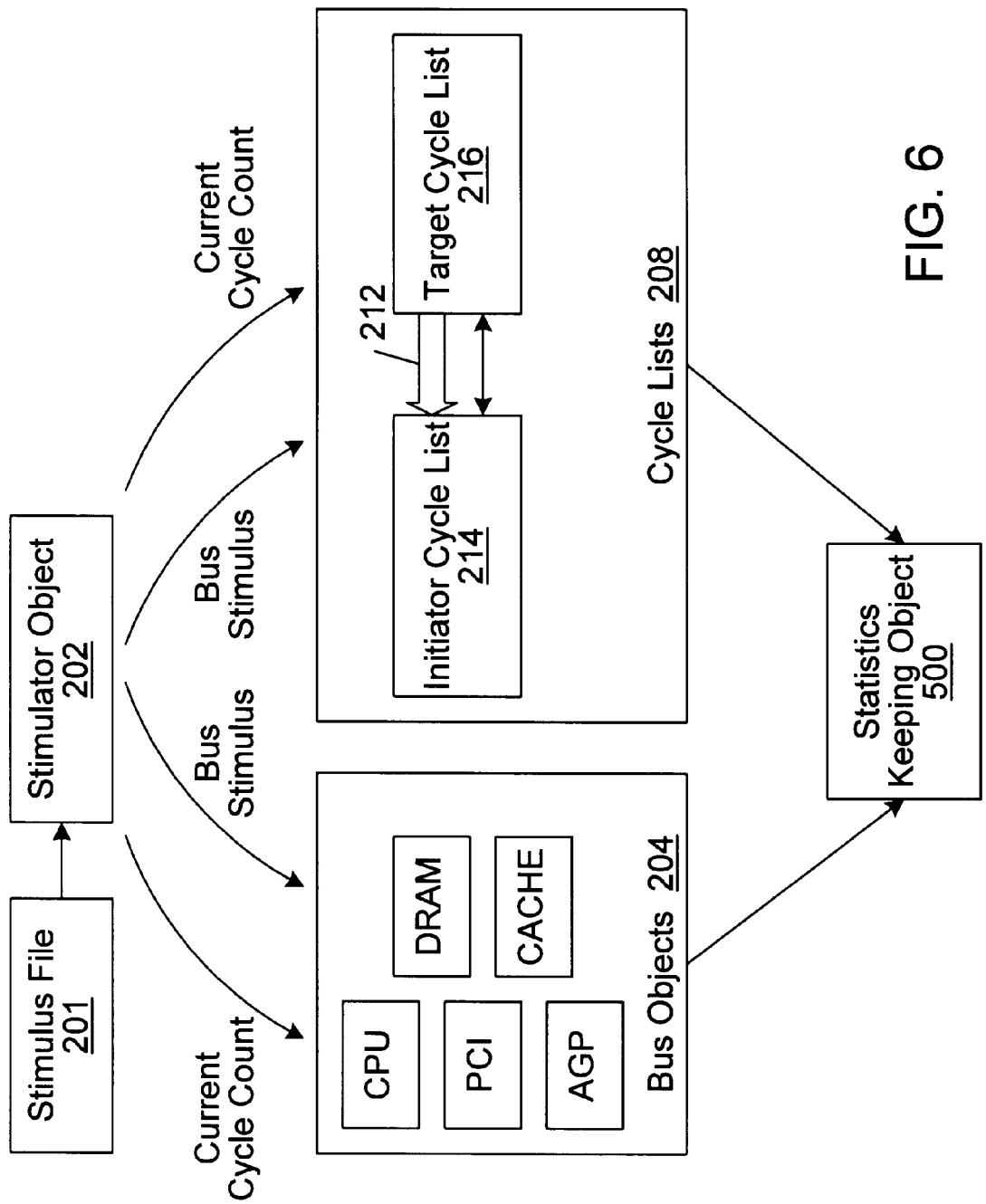
FIG. 6 depicts linked objects to statistically monitor performance and resource usage in a bus bridge system.

In a further implementation, bus bridge performance and resource usage may also be monitored. As earlier described in connection with FIGS. 2 and 3A, bus objects 204 and bus cycle lists 208 receive a bus stimulus from the stimulator object 202 on a clock cycle basis. This stimulus can be provided through a stimulus file 201. The stimulator object may further be configured to also pass, on a clock cycle basis, the current cycle count to each object, 204 and 208, in the bus bridge verification system. A statistics keeping object 500 or monitor object is created and stored in the system memory. The statistics keeping object 500 is linked to the cycle lists 208 and to the bus objects 204 as shown in FIG. 6.

By keeping a stored cycle count for each state transition, each bus cycle object can send elapsed time information to statistics keeping object 500 for performance monitoring. The cycle lists 208 report resource usage by tracking the type and number of cycles that enter the bus bridge 101 (FIG. 1A). The monitor object 500 then tracks the number of pending cycles that accumulate within the bus bridge. Messages are sent to the statistics keeping object on each clock cycle indicating the current usage of each tracked resource.

Some uses of the statistics keeping system may include, but are not limited to, the following: (1) Cycle completion monitoring and test coverage by bus cycle type can be tracked with the messages from bus cycle state machine objects; (2) Request to grant latency monitoring and arbitration scheme verification can be tracked with messages from different state machines of the bus objects 204; and (3) Usage of the bus bridge's posted write buffer can be monitored with messages from the cycle lists 208.

By monitoring the state of the bus bridge in a device independent manner, false failures can be eliminated and tighter verification of bus bridge operation can be accomplished.

Referring back to FIG. 1B, in this embodiment, a model of the bus bridge 600 is created as an object with storage space allocated for a copy of each of the bus bridge's configuration registers. This object is also suitably stored in the appropriate system memory. As described with reference to FIG. 3A, each bus cycle state machine object also monitors the stimulus (from the stimulator object 202) passed to it. As the CPU write cycle state machine object monitors the stimulus, it sends bus cycles intended for the bus bridge 101 to the bus bridge object 600 also. Using the data from these cycles, the model 600 updates its configuration registers accordingly. In this manner, the current configuration state of the bus bridge 101 is always known.

Because the bus bridge model 600 obtains its data directly from the CPU write cycle state machine objects, the implementation is not dependent on the actual bus bridge physical implementation. Future bus bridge designs can be tested using the same verification system by simply providing a new bus bridge model, in software, with the proper configuration register mapping, allowing direct ports for the rest of the verification system objects.

The bus bridge model object 600 provides query functions that return information on the bus bridge's state based on function input parameters. By way of example only, bus cycle objects—i.e. the bus cycle state machine objects stored in one or more of the cycle lists 208 (FIGS. 1B and 3A)—can directly poll the bus bridge object 600 to determine if their address is remapped by the bus bridge 101. This effectively eliminates the problems occurring in previous methodologies where bus bridges failed to preserve address counts in situations involving memory remapping. Bus cycle objects can also poll the bus bridge model for information on their target resolution source. For example, CPU cycles can poll the bus bridge model 600 for DRAM or PCI cycle resolutions when a CPU cycle has a DRAM cycle or a PCI cycle as its target. This allows the bus cycle state machines to verify that the bus bridge 101 is asserting correct signals in each bus protocol. In addition to the bus cycles, various bus objects 204 (FIG. 3A), through their state machines, can also poll the bus bridge model 600 for pertinent information. For example, an AGP bus object can query the bus bridge object 600 to determine its operating mode, i.e. a piped mode or an SBA mode. Finally, a cache model object 702 (described below) can also be configured to query the bus bridge object 600 to find information about cache configuration, such as cache size, write-back or write through cache, etc.

In a bus bridge verification methodology, it may also be important to verify cache operation. Further, non-cache bus cycles should be able to determine if their resolving target cycles should come from the cache or DRAM when the bus bridge model 600 (FIG. 1B) indicates that the resolving target cycles should come from the memory subsystem. In accordance with one embodiment, a verification methodology for checking that cache coherency is preserved by a cache controller is employed.

Figure 7A:
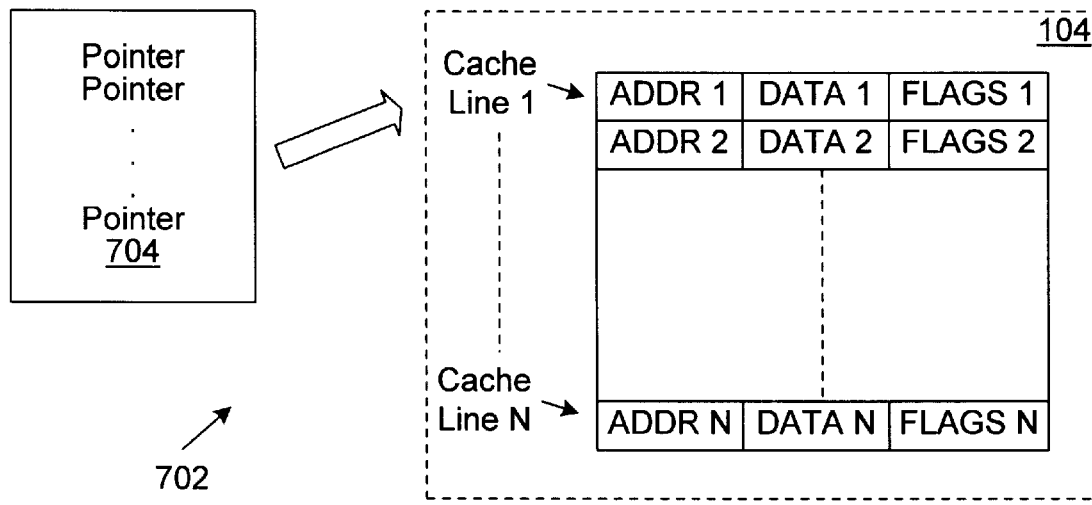
FIG. 7A shows a cache model object created to check cache coherency.
Figure 7B:
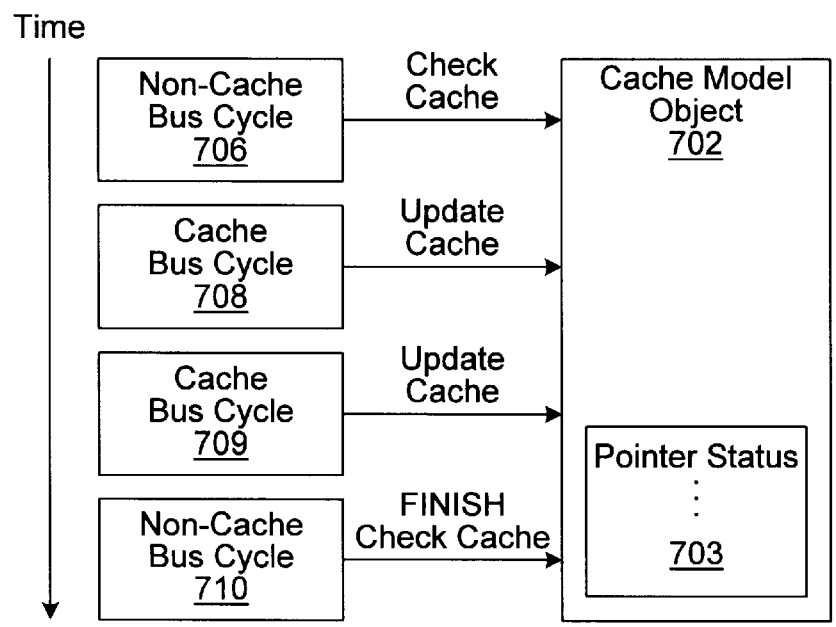
FIG. 7B is for a verification methodology using the cache model object in FIG. 7A to check cache coherency during cache and non-cache bus cycles.

Referring now to FIGS. 7A and 7B, a model 702 of the cache 104 (FIG. 1A) with storage for the address and data contained in each cache line and a flag indicating the state of the cache line (e.g., MESI state or other cache coherency protocol state) is created. In one embodiment, initially, it may be desirable to store only pointers 704, one for each cache line, in the cache model and to later dynamically store the contents of each cache line, including its address and data, as it is being allocated by memory. Thus, memory for pointers corresponding to the cache lines is initially provided. A valid bit may further be provided to indicate whether a particular pointer is valid. When a line in the cache memory 104 is allocated by the bus master, a corresponding location in system memory for tracking by cache model 702 of the line is also allocated. A value corresponding to this location is then used as a pointer 704 to that memory location to allow for updates and status checking when transactions associated with or affecting the line occur. This arrangement may result in less storage space requirements. For example, if each pointer block 704 is of 4 bytes and if the cache size is 4 K, then an initial storage space of only 16 kB is required. This is a substantial saving in storage space when compared with storage requirements for the whole cache—i.e., for example, if each cache line stores 4 bytes of address, 32 bytes of data and 1 byte of flag bits, then for a cache of 4 K size, a minimum storage space of 148 KB would be required.

In another approach, a linked list can be created in the cache model object 702 to store each cache line as it is being accessed. Although this method results in less storage space than the pointer-based approach, it nonetheless increases search operation time due to its sequential nature of cache line search. In contrast, an array of cache pointers can be effectively utilized to randomly access a cache line.

The cache model object 702 also contains a dynamically allocated cycle list 703 configured to store pointers to non-cache cycles (i.e., bus cycle state machine objects corresponding to busses other than the cache bus) that are initiated in the multi-bus system. Referring to FIG. 7B, an operational scheme to check cache coherency and utilization is depicted. Each non-cache bus cycle in the initiator cycle list (block 214 in FIGS. 1B and 3A) sends a Check Cache message to the cache model 702 as represented by block 706 in FIG. 7B. Each cache bus cycle sends an Update Cache message to the cache model object 702, as shown by blocks 708 and 709 in FIG. 7B. Each cache bus cycle will be stored in the target cycle list 216 (FIGS. 1B and 3A ), whereas non-cache bus cycles may be in the initiator cycle list 214 (FIGS. 1B and 3A) obtaining its resolution from various cycle objects, as discussed previously with respect to FIG. 1B.

Update Cache messages serve to update the cache model state. Update Cache messages also serve as signals to instruct the cache model 702 to perform coherency tests on pending non-cache bus cycles in the cycle list 703. As each non-cache bus cycle enters its TARGPEN state, i.e., a state indicating that all protocol tests have been successfully completed, it sends a Finish Check Cache message to the cache model 702 as shown by the block 710 in FIG. 7B. The bus cycle state machine object representation of each bus cycle in the bus bridge system and various cycle completion and data resolution mechanisms employing these state machine objects were described previously. The FINISH state is the last state in the sequence of state transitions for a bus cycle state machine object. The Finish Check Cache message indicates that no further coherency tests are to be performed on the non-cache bus cycle that sent the Finish Check Cache message. A more detailed description follows.

As each non-cache bus cycle is created, it sends a Check Cache message with a pointer to itself to the cache model (Block 706). The cache model 702 determines an initial testing state for the non-cache bus cycle dependent upon the type of the bus cycle, the presence of the memory address in the cache and the state of the cache line if the address is present in the cache. The pointer to that bus cycle and its initial testing state, are then stored in the dynamically allocated cycle list 703. The pointer may be treated as an object contained by the cache object 702. As each new non-cache bus cycle is initiated, a pointer entry is placed on the bottom of the cycle list 703.

Cache cycles send Update Cache messages to the cache model 702 when they have completely determined their data. These Update Cache messages include the physical address of the cache line accessed, the data, and a flag indicating if the access was a read or write. The cache model 702, in turn, uses these messages to keep its internal line state up-to-date and to perform coherency and efficiency checks.

All testing pertaining to each bus cycle is performed on the receipt of Update Cache messages. When an Update Cache message is received, the dynamically allocated list 703 contained in the cache object is searched from the top to bottom, i.e. from the oldest to the newest cycle entry, for an initiated bus cycle whose address matches the address sent by the Update Cache message. When such a bus cycle is found, depending on the cycle's assigned initial testing state (block 704, FIG. 7A), a series of tests are performed and the cycle's testing state is updated. In one embodiment, these tests are performed to determine whether coherency in the system has been properly maintained. For example, depending upon the state of a cache line which is accessed as a result of a particular cycle, other cycles such as DRAM cycles may also be invoked in response to the initiator cycle. The test status information maintained and provided by the cache model may include information regarding the type of cycles which should be invoked as a result of the initiator cycle for proper resolution. Certain tests may further be scheduled and conducted to determine whether the state of a cache line has been updated properly, whether certain cycles should be aborted, etc, as desired, depending upon the particular cache operation being verified. Failed tests may indicate a failure in the system with respect to coherency.

When each non-cache bus cycle transitions to the FINISH state, it sends a Finish Check Cache message to the cache object 702 as shown by block 710 in FIG. 7B. This message signals that all updates of test state for the given non-cache cycle should be complete. Upon receipt of the Finish Check Cache message, the test state for that bus cycle is checked. If the test state for that cycle is not "passed", then an error message is recorded in the cycle history file described previously. The error message can be retrieved by printing or accessing the contents of the cycle history file. A scheme similar to that described with reference to FIG. 3A, i.e. having an error file to store the test data can also be conveniently employed. After the error message has been recorded or the cycle has passed any coherency tests conducted, the pointer to the cycle in the cycle list 703 is removed.

In the above cache-master verification system, each bus cycle in the initiator cycle list 214 (FIG. 1B) polls the cache verification model 702 (FIG. 1B) to determine if its address is currently stored in the cache. If the address is in the cache model 702, then that bus cycle in the initiator cycle list 214 uses this information in combination with other system data to determine the source of its target resolution cycles.

When a cache copyback cycle due to non-INV snoops occurs, it is placed in the target list 216 as well as in the initiator cycle list 214 (FIG. 1B). The PCI read cycle that generated the snoop, and which itself will be in the initiator list, will obtain its resolution from the copyback cycle in the target list. The copyback cycle in the initiator list will obtain its resolution from the DRAM cycle. Thus, a partial cache write can be coherently resolved. A cache read cycle, caused by cache line replacements, is, however, placed in the initiator cycle list 214. It will be resolved by the resulting DRAM write in the target list 216. Thus, a methodology to reliably and efficiently detect cache coherency errors in all bus cycles is provided, in addition to detection of inefficient cache use by a cache controller.

The system described above may thus allow multiple test simulations in a multi-bus environment. The various system objects may interact according to the command flow diagram of FIG. 1B and the discussion above. When a complete resolution, on a cycle-by-cycle basis, is achieved, both the initiator cycle list and the target cycle list should be empty. The objects discussed above e.g. the stimulator object, the bus cycle state machine objects, the bus objects, the cycle lists, the cache model etc., may be instantiated by declaring them in the MAIN function supported by the C++ programming language and stored in an appropriate system memory.

It is noted that the present discussion refers to the assertion of various signals. As used herein, a signal is "asserted" if it conveys a value indicative of a particular condition. Conversely, a signal is "deasserted" if it conveys a value indicative of a lack of a particular condition. A signal may be defined to be asserted when it conveys a logical zero value or, conversely, when it conveys a logical one value.

In a situation when bus cycles to addresses are aborted without being completed, the corresponding bus cycle state machine objects may sense this through the bus stimulus being received from the stimulator object and may be configured to automatically transition their states, in response thereto, to the FINISH state or destroy themselves without further transitioning their states. Thus, failures due to aborted bus transactions may be eliminated. In addition, the system may also monitor and record bus bridge performance, and may also verify correct behavior of the bus bridge cache master.

Chipset devices are characterized by the primary function of processing incoming bus cycles and generating subsequent bus cycles on different busses as a result. Therefore, in the area of verifying functionality of an HDL (Hardware Description Language) design of a computer system component (e.g. in Verilog or in VHDL, etc.), the HDL design may first be simulated. The HDL design may model an RTL design or a structural design of the computer system component. The bus that receives incoming bus cycles and the bus that carries outgoing bus cycles may also be simulated. The stimulus file 201 (FIG. 3A) then applies one or more test stimuli to the simulated bus that receives incoming signals. The stimulus file may apply those one or more test stimuli on a per-clock basis as earlier described. The response by the simulated HDL design to the received stimulus is then transmitted onto the simulated bus that carries outgoing signals. A transaction checker, which may include the cycle lists 208, is coupled to the simulated bus that carries outgoing signals to receive information relating to cycles initiated on that bus. The transaction checker resolves bus cycles as generally described with reference to FIG. 2.

By employing this scheme using two different busses—one to apply a stimulus and the other to resolve the bus cycle through transaction checking—an effective decoupling of test stimulus from the checking environment is achieved. This avoids the necessity to run a stimulus and then compare it to a previous run, thereby increasing the number of tests that can be run and compared. Additionally, in the case of programming the expected data into the test, the need to update the tests when the device under test is updated may be obviated. Decoupling the test stimulus from the checking environment further allows running tests that execute concurrently with other tests, i.e. multiple tests manipulating the same registers or memory locations. The test suite can be written to be very efficient and independent of device-under-test modifications and enhancements.

The behavior of the device from an external perspective can be tracked by the transaction checker which identifies bus cycles and activities, logs them, and then compares or maps the bus cycles on various busses together to determine whether proper operation has occurred. All these can be conveniently performed using the object-oriented programming approach outlined earlier. Due to the decoupling, the test environment can be made more aggressive and robust, and can be used to generate random responses, remap memory, inject errors into data streams etc.

In addition to decoupling the test stimulus from the checking environment, it may be advantageous to have incoherent external memory space while testing an HDL design of a computer system component. The memory incoherence may maximize functional verification of the device under test. Historically, the verification of a device has utilized external memory areas, which are required to be coherent in order to verify that data read is equivalent to data written. This restricts the sequences of operations that may be applied to a device. Typically, data is written to memory and later read back, expecting that the data read will be identical to data written. For every read, a previous write or a master initialization must have been performed. At the very least, this wastes simulation time in setting up the external memory.

If the memory coherency is removed, the stimulus applied to the device during reads may no longer be constrained to previously initialized or written values to the memory. That is, a memory read stimulus from the stimulus file 201 to the device under test may not have to be dependent on a prior memory write stimulus, also from the stimulus file 201, to that device. Further, a memory write stimulus to the HDL design of the device under test may be followed by a memory write operation initiated by another device in the computer system, and these, in turn, may be followed by a memory read stimulus to the device under test. The stimulus file 201 may also contain a number of additional stimuli, besides the memory read and memory write stimuli. A scheme similar to the one described in connection with bus cycle resolution during byte collapsing (FIGS. 5A, 5B and 5C) may be conveniently employed in which the transaction checker associated with the HDL design of the computer system component under test may include a combine list 402 as part of its cycle lists 208. This arrangement may assure proper cycle resolution and hence correct testing of the device.

The advantages of having functional verification of a device through incoherent external memory spaces include: (1) The device under test can read from anywhere it desires, expanding its effective memory range; (2) Automatic memory relocation tables can be generated upon each initial access to memory areas, relieving the test simulation from the requirement to set up limited tables in advance. This also allows the randomization of the memory relocation table mappings. More memory locations can be spanned with dynamic storage allocation rather than reserving large amounts of memory upon the initialization of a test. Memory accesses with relocation can therefore be scattered more widely over the available memory space rather than having them congested in a single or a few small areas. Different devices under test may read or write the memory space without following a predetermined sequence of operations;

(3) Errors can be injected into the data being retrieved to test proper response of the device under test to externally corrupted data, i.e. whether the device under test can properly recover in such an environment. Errors can be randomized if desired; (4) The non-coherent nature of the memory also allows for easier modeling of externally modified components or locations such as cache memory within a processor that is modified dynamically by a CPU. Memory with additional tag and status information is also much more easily varied. For example, a MESI cache within a CPU can be configured to return multiple states (Modified, Exclusive, Shared, Invalid) and different data upon each access by the device under test, without having to synchronize CPU activity with the activity of the device.

Figure 8:
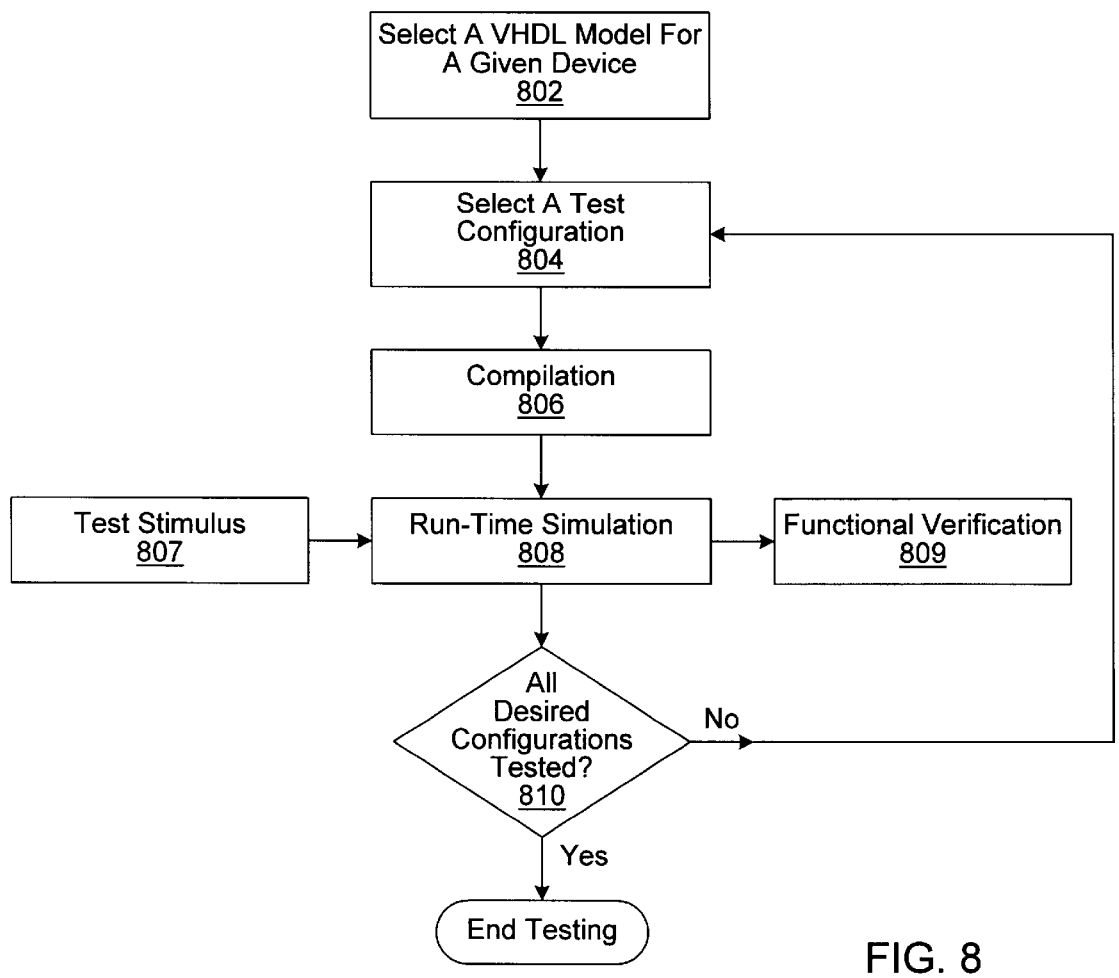
FIG. 8 is an operational flow diagram for creation of a configuration-independent test suite for testing an HDL design of a computer system component.

The flexibility of functional verification of an HDL design of a computer system component or device may further be improved by allowing the test stimulus from the stimulus file 201 and the checking mechanism, which may incorporate the cycle lists 208, to be decoupled from the programmed mode or configuration of the device under test. Referring now to FIG. 8, an operational flow diagram for creating a configuration-independent test suite is shown. As shown under block 802, initially, a VHDL [VHSIC (Very High Speed Integrated Circuit) Hardware Definition Language] model for the design of the computer system component to be tested is selected. The VHDL model may be simulated, preferably with a user-supplied test configuration (block 808). Possible test configurations may include such information as the amount of memory populating the system, the number of banks of memory, type of memory, addresses of PCI bus masters/slaves, modes of external devices, the type of the processor etc. Permuting a test suite across all of these options would result in extremely large numbers of tests. To keep the number of tests manageable, configuration and bus stimulus are separated, with the configurations defined dynamically at run time based on parameters passed into the simulation at run time. These steps are depicted through blocks 804, 806 and 808 in FIG. 8. As shown there, the test stimulus (block 807) and the functionality verification of the device under test (block 809) are performed in a manner that is independent of the test configuration selected under step 804. As an example only, the selection of the test configuration under step 804 may include determination of amount, type and number of memory banks in the system, ascertainment of the operating mode of an external device or of the device under test, computation of an address of a PCI device, or selection of the type of a CPU. These and other parameters may be taken into account depending on the device under test and depending on the problem to be solved. Every desired test configuration is first compiled and then simulated at run-time without having to modify the set of test stimuli stored in the stimulus file 201 or to redefine on every new simulation the transaction checking or functional verification mechanism.

By decoupling the test configuration from the test stimulus and checking mechanisms, the test suite can be written to be very efficient and independent of the test mode. Furthermore, migration to next generation products are simplified due to the need to update the configuration routines independently, allowing the bus stimulus to remain intact. In one embodiment, the set of possible test configurations may be modeled through an internal configuration interpretation mechanism in the system memory. The configuration interpretation mechanism stores VHDL models of various components of the computer system, e.g. microprocessors, memories, I/O devices etc. In FIG. 8, the user selects a test configuration through appropriate VHDL models from the configuration interpretation mechanism (block 804). These selected VHDL models and the VHDL model of the design of the computer system component being tested are compiled prior to simulation (block 806). The test configuration is then dynamically defined through run-time simulation (blocks 808, 810). This allows the VHDL model of the device under test to respond to the test stimulus in a manner consistent with the dynamically programmed configuration.

Figure 9:
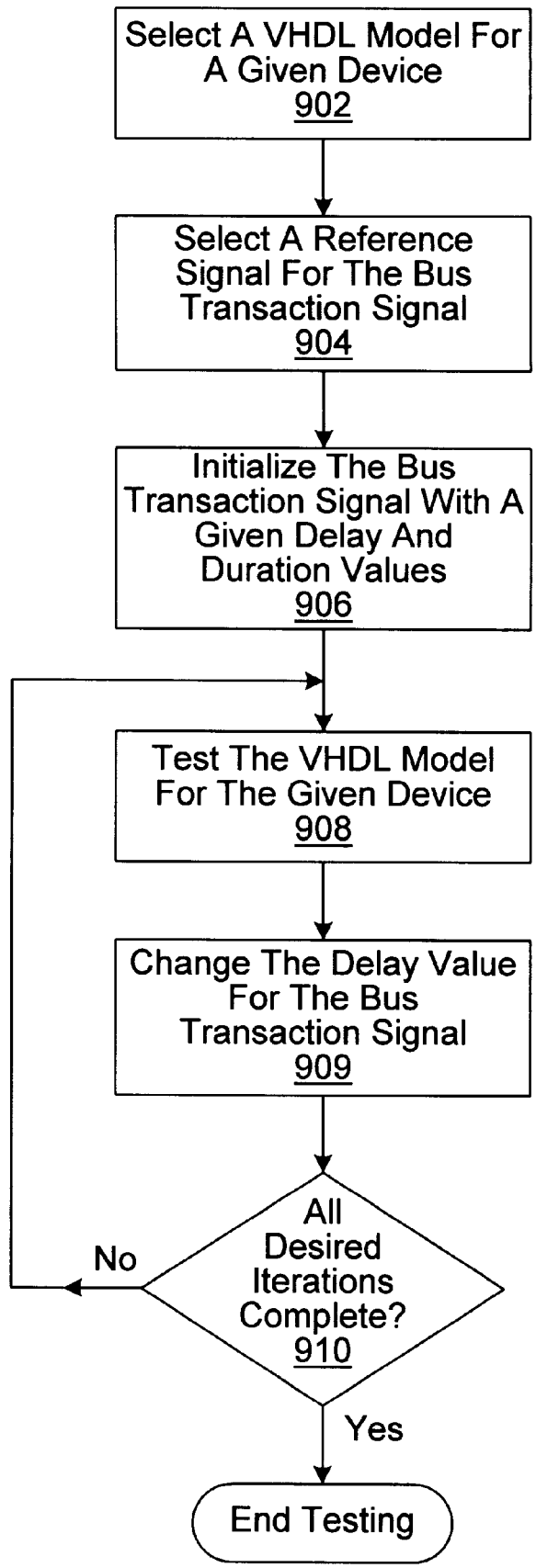
FIG. 9 is a flow chart for timing-related functionality testing during pre-silicon verification of a computer system component design.

Referring now to FIG. 9, a flow chart for detecting timing-related functional problems in a device prior to its manufacture (i.e. silicon fabrication) is shown. The flow chart depicts a method that allows converting system waveform relationships, which could be observed on a physical system incorporating a manufactured version of the computer system component under test, into simulation waveforms with the same relative relationships. This technique allows clock by clock skewing of one event with respect to another to validate an entire window of functionality between the two events.

After selecting a VHDL model for the computer component or device to be tested (block 902, FIG. 9), a reference point or signal (such as an external bus cycle for a chipset device, or a stimulus from the stimulus file) is selected for a given signal or signals, i.e. the bus transaction signal (block 904). The reference signal is preferably user-defined, and may include any signal in the system. The bus transaction signals may include a memory read signal, a memory write signal, an interrupt request signal, or a stimulus from the stimulus file, etc. This bus transaction signal may then be initialized with given values for its duration and its delay with respect to the reference signal (block 906). The reference signal could be any other signal on the bus with whose respect the bus transaction signal parameters are chosen. The testing can then proceed through multiple iterations, with the delay between the reference signal and the bus transaction signal being changed for each such iteration (blocks 908–910). The delay may be varied at run-time through user input or the stimulus file 201 may be configured to automatically generate a range of delayed stimuli during simulation. The variations in the delay values may be predetermined or may be randomized. Additionally, the delay may be varied on a per-clock basis or on every alternate clock or in any other user-defined way. Similarly, testing may be carried out by varying the duration of the bus transaction signal and keeping its delay with respect to the reference signal fixed. Or, both delay and duration values may be varied. Besides delay and duration, other signal parameters (e.g. amplitude, frequency etc.) may also be chosen to test device's response to variations in inter-signal relationships.

This action moves a signal (the bus transaction signal) with respect to another bus cycle or signal on a given bus, and the response of the device under test is evaluated for each desired test iteration to explore that device's response to varying inter-signal relationships. The bus transaction signal may be varied with respect to more than one bus cycle or signal, involving multiple other busses or interfaces. During simulation, multiple stimuli on multiple simulated busses may occur, and one or more stimuli may generate activities on more than one busses also. The testing scheme described here will select a specific signal (the bus transaction signal) and will move it with respect to another signal, while keeping all other activities on multiple busses or interfaces running. This technique allows evaluations of timing-related functional problems that were not thought of by the designer of the device. Such an evaluation is a key aspect of producing a robust product, because many unexpected signal relationships could occur in a complex logic product. Problems that were once found only after the device was manufactured can now be detected prior to the manufacturing stage.

Hence, an efficient and reliable transaction checking system for verifying bus bridges in multi-master bus systems has been disclosed. By treating each bus cycle as an individual persistent object, the system ensures that all cycles initiated by bus masters reach their destinations without corruption of cycle address or data. Additionally, verification methodologies to maximize functional verification of an HDL design of a computer system component are also disclosed.

Numerous variations and modifications will become apparent to those skilled in the art once the above disclosure is fully appreciated. Therefore, it is intended that the following claims be interpreted to embrace all such variations and modifications.

What is claimed is:

1. A verification system for verifying operation of an HDL design of a computer system component configured to interface between a first bus and a second bus, said verification system being executable by a computer system having a memory and a CPU, said verification system comprising:

a stimulus file stored in said memory which specifies a designated stimulus to be applied to a simulation of said first bus;

a simulated model of said HDL design of said computer system component which receives said designated stimulus and responds according to said HDL design; and a transaction checker stored in said memory and coupled to receive information relating to bus cycles initiated on a simulation of said second bus by said simulated model of said HDL design of said computer system component in response to said designated stimulus.

2. The verification system according to claim 1, wherein said HDL design of said computer system component is in Verilog.

3. The verification system as in claim 1, wherein said stimulus file provides said designated stimulus on a clock cycle basis.

4. The verification system according to claim 1, wherein said transaction checker comprising:

an initiator cycle list stored in said memory, wherein said initiator cycle list being configured to dynamically store a first plurality of bus cycle state machine objects instantiated upon initiation of bus cycles on said simulation of said second bus by said simulated model of said HDL design of said computer system component; and a target cycle list stored in said memory, wherein said target cycle list is configured to dynamically store a second plurality of bus cycle state machine objects instantiated upon initiation of bus cycles to be sent to a plurality of bus targets by said simulated model of said HDL design of said computer system component.

5. A method for verifying operation of an HDL design of a computer system component configured to interface between a first bus and a second bus, said method being executable by a computer system having a memory and a CPU, said method comprising:

creating a simulated model of said HDL design of said computer system component;

coupling said simulated model to a simulation of said first bus and to a simulation of said second bus;

applying a designated stimulus from a stimulus file stored in said memory to said simulated model through said simulation of said first bus;

configuring said simulated model to transmit a response to said designated stimulus onto said simulation of said second bus in accordance with said HDL design; and receiving and analyzing said response to said designated stimulus through a transaction checker stored in said memory and coupled to said simulation of said second bus.

6. The method as in claim 5, wherein said response to said designated stimulus includes information relating to cycles initiated on said simulation of said second bus by said simulated model of said HDL design of said computer system component.

7. The method according to claim 4, wherein said receiving and analyzing said response to said designated stimulus includes:

(a) identifying bus cycles initiated by said simulated model in response to said designated stimulus;

(b) logging said identified bus cycles;

(c) comparing said identified bus cycles with a plurality of bus cycles on a simulation of at least one of a plurality of system buses excluding said simulation of said first bus; and (d) determining accuracy of said response to said designated stimulus based on said comparison in step (c).

* * * * *